(12) United States Patent
Han

(10) Patent No.: US 10,199,540 B2
(45) Date of Patent: Feb. 5, 2019

(54) LIGHT EMITTING DIODE, LIGHT EMITTING DIODE PACKAGE INCLUDING SAME, AND LIGHTING SYSTEM INCLUDING SAME

(71) Applicant: LG INNOTEK CO., LTD., Seoul (KR)

(72) Inventor: Jae Cheon Han, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/542,736

(22) PCT Filed: Jan. 12, 2016

(86) PCT No.: PCT/KR2016/000258
§ 371 (c)(1),
(2) Date: Jul. 11, 2017

(87) PCT Pub. No.: WO2016/114541
PCT Pub. Date: Jul. 21, 2016

(65) Prior Publication Data
US 2017/0358708 A1  Dec. 14, 2017

(30) Foreign Application Priority Data
Jan. 12, 2015  (KR) .................. 10-2015-0004017

(51) Int. Cl.
*H01L 33/14* (2010.01)
*H01L 33/38* (2010.01)
*H01L 33/32* (2010.01)

(52) U.S. Cl.
CPC ............ *H01L 33/145* (2013.01); *H01L 33/38* (2013.01); *H01L 33/32* (2013.01)

(58) Field of Classification Search
CPC ........ H01L 33/38; H01L 33/145; H01L 33/20; H01L 33/387; H01L 33/385
See application file for complete search history.

(56) References Cited

U.S. PATENT DOCUMENTS

2001/0048112 A1   12/2001  Koide et al.
2012/0061704 A1    3/2012  Jeong et al.
(Continued)

FOREIGN PATENT DOCUMENTS

JP   3780887 B2   5/2006
JP   2007-35781 A   2/2007
(Continued)

OTHER PUBLICATIONS

International Search Report, issued in PCT/KR2016/000258, dated May 12, 2016.

*Primary Examiner* — Frederick B Hargrove
(74) *Attorney, Agent, or Firm* — Birch, Stewart, Kolasch & Birch, LLP

(57) ABSTRACT

A light emitting diode according to one embodiment comprises: a substrate; a light emitting structure including a first conductive semiconductor layer, an active layer, and a second conductive semiconductor layer, which are on the substrate; a first pad electrode part on the first conductive semiconductor layer; a current blocking layer on the second conductive semiconductor layer; a second electrode on the first conductive semiconductor layer and the current blocking layer; and a second pad electrode part on the second electrode, wherein the width of the current blocking layer can become thicker as the current blocking layer becomes closer to the first pad electrode part from the second pad electrode part.

14 Claims, 9 Drawing Sheets

(56) References Cited

U.S. PATENT DOCUMENTS

| | | | |
|---|---|---|---|
| 2012/0211788 A1* | 8/2012 | Yuh | H01L 33/145 |
| | | | 257/98 |
| 2012/0299048 A1 | 11/2012 | Lee | |
| 2013/0234192 A1* | 9/2013 | Kim | H01L 33/38 |
| | | | 257/98 |
| 2015/0108520 A1* | 4/2015 | Kim | H01L 33/38 |
| | | | 257/98 |

FOREIGN PATENT DOCUMENTS

| KR | 10-1054112 B1 | 8/2011 |
|---|---|---|
| KR | 10-1063907 B1 | 9/2011 |
| KR | 10-2012-0131983 A | 12/2012 |
| KR | 10-2014-0056929 A | 5/2014 |

* cited by examiner

[Figure 1]
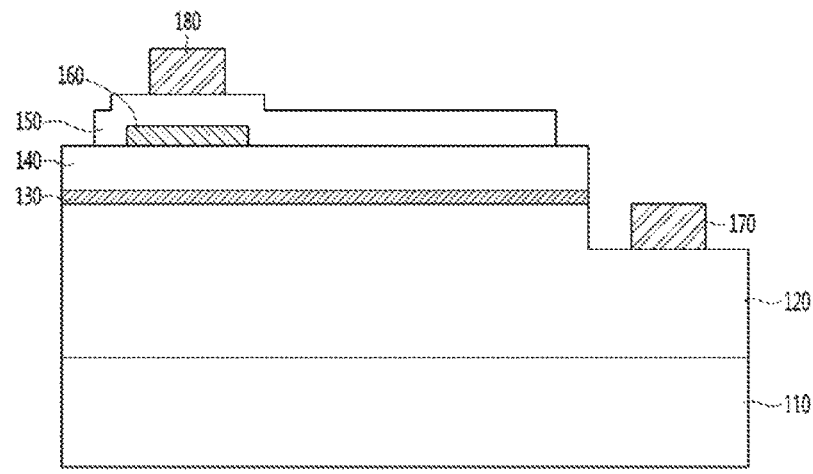
[Figure 2]
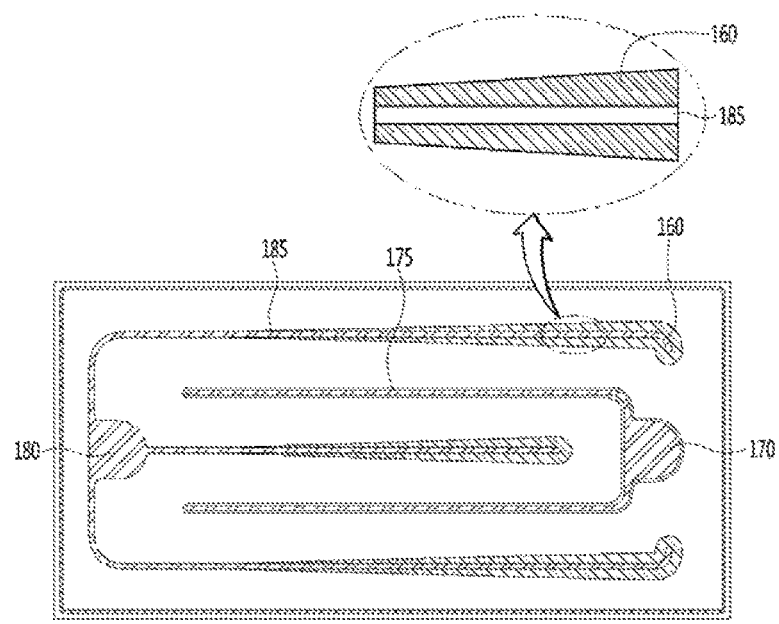

【Figure 3】
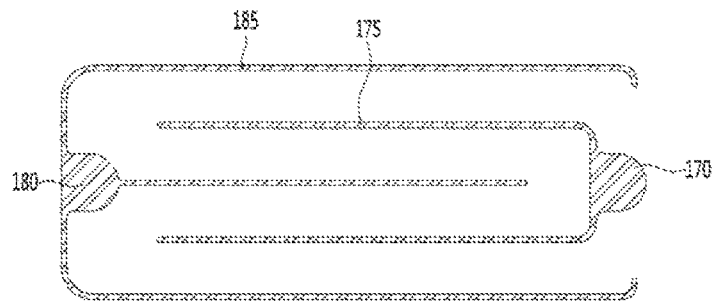
(a) metal pattern
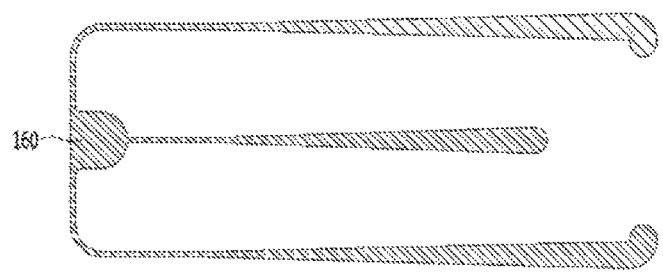
(b) CBL pattern
【Figure 4】
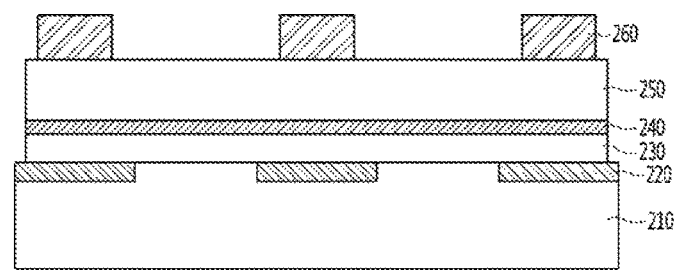

[Figure 5]
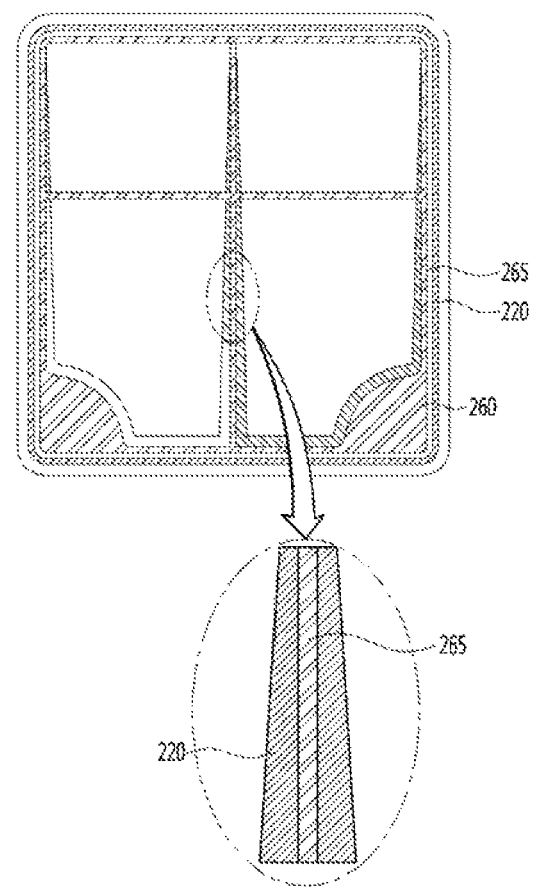

【Figure 6】
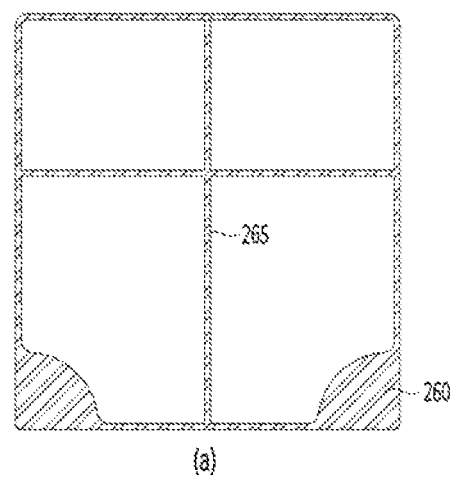
(a)
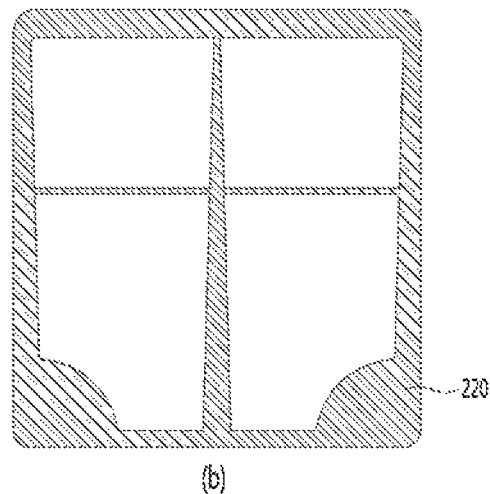
(b)

[Figure 7]
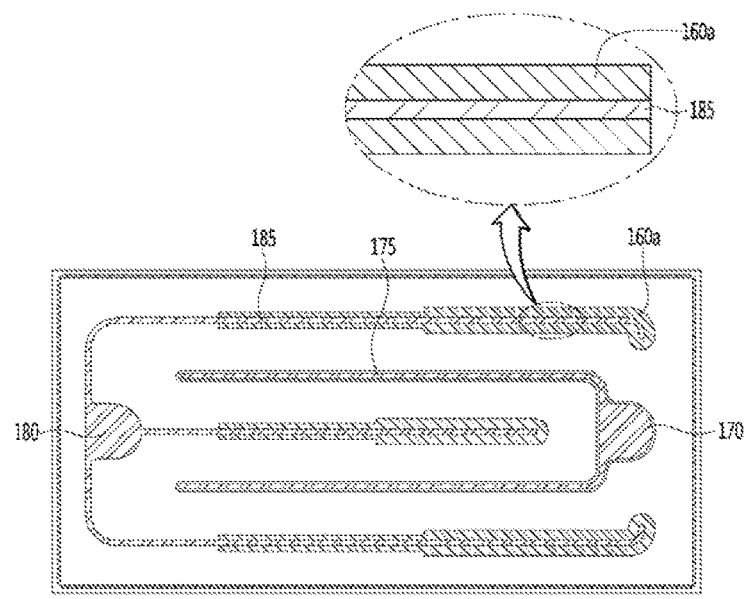

[Figure 8]
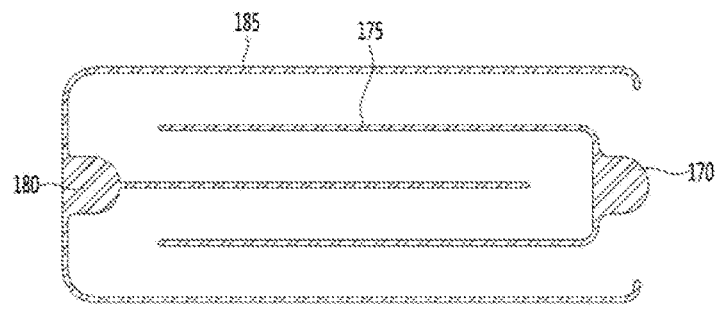
(a) metal pattern
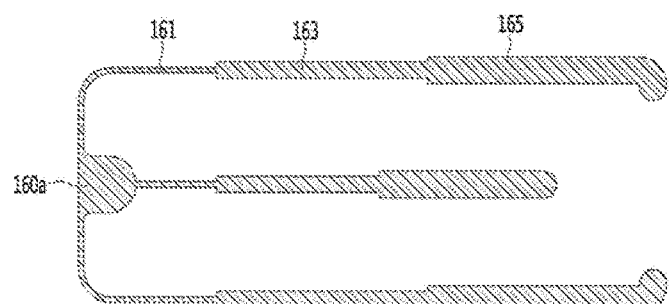
(b) CBL pattern

[Figure 9]
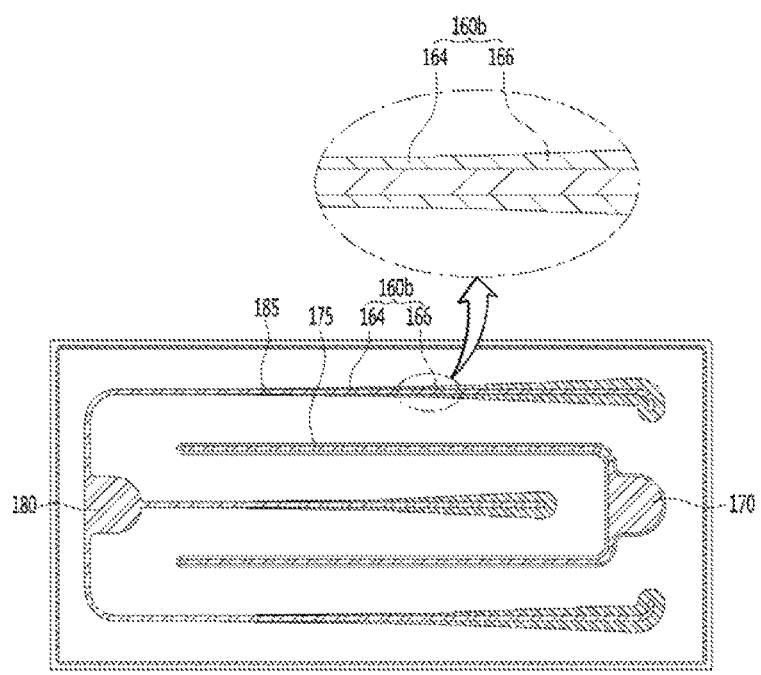

[Figure 10]
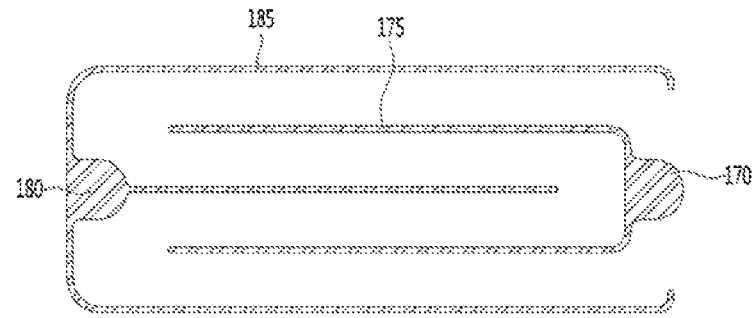
(a) metal pattern
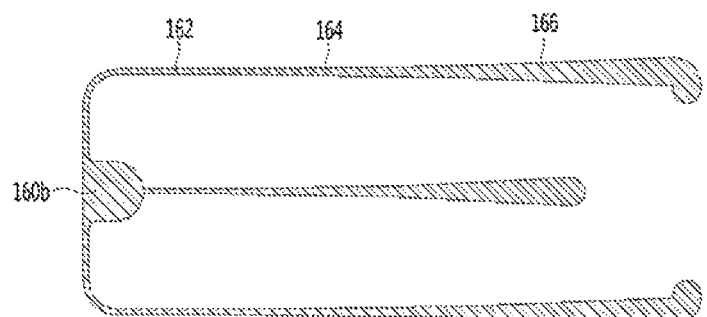
(b) CBL pattern
[Figure 11]
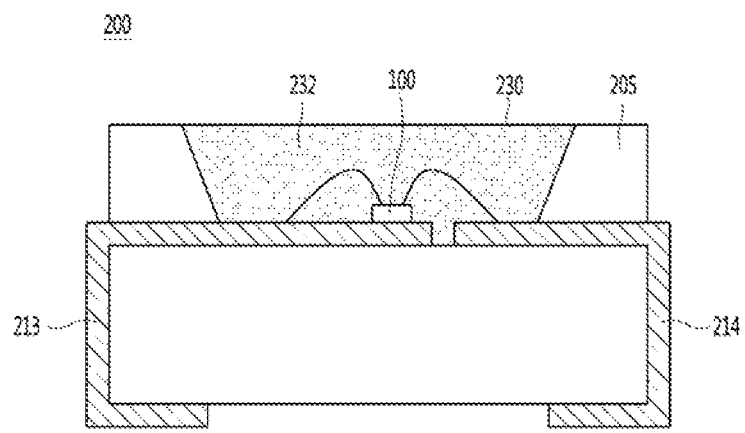

[Figure 12]
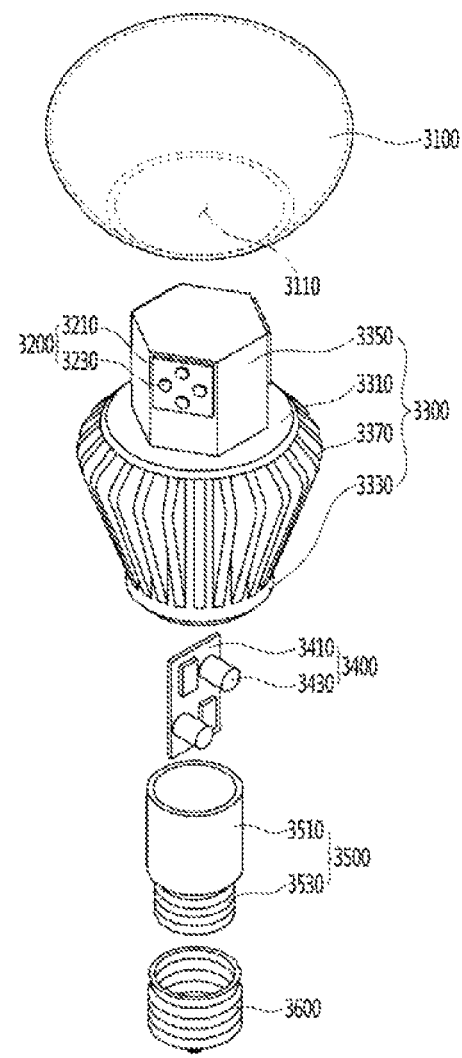

LIGHT EMITTING DIODE, LIGHT EMITTING DIODE PACKAGE INCLUDING SAME, AND LIGHTING SYSTEM INCLUDING SAME

CROSS REFERENCE TO RELATED APPLICATIONS

This application is the National Phase of PCT International Application No. PCT/KR2016/000258, filed on Jan. 12, 2016, which claims priority under 35 U.S.C. 119(a) to Patent Application No. 10-2015-0004017, filed in the Republic of Korea on Jan. 12, 2015, all of which are hereby expressly incorporated by reference into the present application.

TECHNICAL FIELD

The present invention relates to a light emitting diode, a light emitting diode package including the same, and a lighting system including the same.

BACKGROUND ART

A light emitting diode is a p-n junction diode having a characteristic of converting electric energy into light energy. The p-n junction diode can be formed of compound semiconductors including Group III and V elements of the periodic table. The LED can represent various colors by adjusting the compositional ratio of compound semiconductors.

When forward voltage is applied to the light emitting diode, electrons of an p-layer are combined with holes of a p-layer, so that energy corresponding to an energy gap between a conduction band and a valance band is generated. If the energy is realized as light, the light emitting diode emits the energy in the form of light.

Nitride semiconductors attract a great attention in the optical device and high-power electronic device development fields because of their high thermal stability and wide band gap energy. In particular, blue, green and UV light emitting diodes using nitride semiconductors have been commercialized and widely used.

A conventional light emitting diode can be classified into a lateral type light emitting diode and a vertical type light emitting diode according to positions of electrodes. In both of the lateral type light emitting diode and the vertical type light emitting diode, light generated at a lower portion of a pad electrode does not escape to the outside but is absorbed into a pad, or is reflected into a semiconductor at a lower portion of the pad, and therefore, light extraction efficiency is deteriorated. Hence, a current blocking layer (CBL) is provided at a lower portion of the pad.

However, a light emitting area is decreased by the CBL, and a current concentration phenomenon still occurs in a region close to the electrode.

DISCLOSURE OF THE INVENTION

Technical Problem

Embodiments provide a light emitting diode, a light emitting diode package, and a lighting system, in which a current blocking layer has different line widths in a certain region so as to prevent a current concentration phenomenon.

Technical Solution

A light emitting diode according to an embodiment includes: a substrate; a light emitting structure including a first conductive semiconductor layer, an active layer, and a second conductive semiconductor layer, which are on the substrate; a first pad electrode part on the first conductive semiconductor layer; a current blocking layer on the second conductive semiconductor layer; a second electrode on the first conductive semiconductor layer and the current blocking layer; and a second pad electrode part on the second electrode, wherein the width of the current blocking layer becomes thicker as the current blocking layer becomes closer to the first pad electrode part from the second pad electrode part.

Advantageous Effects

According to the embodiment, current uniformity can be increased by reducing a current concentration phenomenon, and light emitting efficiency can be improved.

Further, according to the embodiment, an area occupied by the current blocking layer is minimized, so that the loss of light emitting area can be minimized.

BRIEF DESCRIPTION OF THE DRAWINGS

FIG. 1 is a sectional view of a light emitting diode according to a first embodiment.

FIG. 2 is a plan view of the light emitting diode according to the first embodiment.

FIG. 3 is a plan view of a second electrode pad part and a current blocking layer according to the first embodiment.

FIG. 4 is a sectional view of a light emitting diode according to a second embodiment.

FIG. 5 is a plan view of the light emitting diode according to the second embodiment.

FIG. 6 is a plan view of a second electrode pad part and a current blocking layer according to the second embodiment.

FIG. 7 is a plan view of a light emitting diode according to a third embodiment.

FIG. 8 is a plan view of a second electrode pad part and a current blocking layer according to the third embodiment.

FIG. 9 is a plan view of a light emitting diode according to a fourth embodiment.

FIG. 10 is a plan view of a second electrode pad part and a current blocking layer according to the fourth embodiment.

FIG. 11 is a sectional view of a light emitting diode package according to an embodiment.

FIG. 12 is an exploded perspective view showing an embodiment of a lighting system including the light emitting diode package according to the embodiment.

BEST MODE FOR CARRYING OUT THE INVENTION

In description of embodiments, when it is mentioned that each layer (film), an area, a pattern or structures are formed "on/over" or "under" a substrate, each layer (film), an area, a pad or a pattern, it means that the mention includes a case where each layer (film), an area, a pattern or structures are formed "directly" or "by interposing another layer (indirectly)". A criterion for "on/over" and "under" of each layer will be described based on the drawings.

A thickness or size of each layer is magnified, omitted or schematically shown for the purpose of convenience and clearness of description. The size of each component does not necessarily mean its actual size.

FIG. 1 is a sectional view of a light emitting diode according to a first embodiment.

Referring to FIG. 1, the light emitting diode according to the first embodiment may include a substrate 110, a light emitting structure including a first conductive semiconductor layer 120, an active layer 130, and a second conductive semiconductor layer 140, which are on the substrate 110, a current blocking layer (CBL) 160 on the second conductive semiconductor layer 140, an ohmic contact layer 150 on the second conductive semiconductor layer 140 and the CBL 160, a first pad electrode part 170 on the first conductive semiconductor layer 120, and a second pad electrode part 180 on the ohmic contact layer 150.

The substrate 110 may be formed of a material having excellent thermal conductivity, and be a conductive substrate or an insulative substrate. For example, the substrate 110 may include at least one of sapphire ($Al_2O_3$), SiC, Si, GaAs, GaN, ZnO, GaP, InP, Ge, and $Ga_2O_3$. An unevenness structure may be formed on the substrate 110, and the section of the unevenness structure may be a circular shape, an elliptical shape, or a polygonal shape. However, the present invention is not limited thereto.

In this case, a buffer layer (not shown) may be formed on the substrate 110. The buffer layer may reduce a difference of lattice constants between the substrate 110 and the material of the light emitting structure, which is subsequently formed. The material of the buffer layer may be formed of Group II to VI compound semiconductors, e.g., at least one of GaN, InN, AlN, InGaN, InAlGaN, and AlInN.

The light emitting structure may be disposed on the substrate 110. The light emitting structure may include the first conductive semiconductor layer 120, the active layer 130, and the second conductive semiconductor layer 140.

The first conductive semiconductor layer 120 is formed of a Group III-V compound semiconductor doped with a first conductive dopant. The first conductive semiconductor layer 120 includes a compositional formula of $In_xAl_yGa_{1-x-y}N$ ($0 \leq x \leq 1$, $0 \leq y \leq 1$, $0 \leq x+y \leq 1$). The first conductive semiconductor layer 120, for example, may include a stack structure of layers including at least one of compound semiconductors such as GaN, InN, AlN, InGaN, InAlGaN, AlInN, AlGaAs, GaP, GaAs, GaAsP, and AlGaInP. The first conductive semiconductor layer 120 may be an n-type semiconductor layer, and the first conductive dopant may be an n-type dopant. The first conductive dopant may include Si, Ge, Sn, Se, and Te. An electrode may be further disposed on the first conductive semiconductor layer.

The active layer 130 is a layer that emits light having energy determined based on energy band difference according to materials constituting the active layer 130 through the recombination of electrons (or holes) injected through the first conductive semiconductor layer 120 and holes (or electrons) injected through the second conductive semiconductor layer 140. The active layer 130 may be formed in any one of a single well structure, a multi-well structure, a quantum dot structure, and a quantum wire structure, but the present invention is not limited thereto.

The second conductive semiconductor layer 140 includes a semiconductor doped with a second conductive dopant, which has, for example, a compositional formula of $In_xAl_yGa_{1-x-y}N$ ($0 \leq x \leq 1$, $0 \leq y \leq 1$, $0 \leq x+y \leq 1$). The second conductive semiconductor layer 140 may be formed of any one of compound semiconductors such as GaN, InN, AlN, InGaN, InAlGaN, AlInN, AlGaAs, GaP, GaAs, GaAsP, and AlGaInP. The second conductive semiconductor layer 140 may be a p-type semiconductor layer, and the second conductive dopant may be a p-type dopant. The second conductive dopant may include Mg, Zn, Ca, Sr, and Ba.

The second conductive semiconductor layer 140 may include a superlattice structure, and the superlattice structure may include an InGaN/GaN superlattice structure or an AlGaN/GaN superlattice structure. The superlattice structure of the second conductive semiconductor layer 140 diffuses a current included in an abnormal voltage, so that the active layer can be protected.

In some embodiments, the light emitting structure may be inversely disposed. For example, the first conductive semiconductor layer may be disposed as the p-type semiconductor layer, and the second conductive semiconductor layer may be disposed as the n-type semiconductor layer. A first conductive semiconductor layer having a polarity opposite to that of the second conductive semiconductor layer may be further disposed on the second conductive semiconductor layer.

The light emitting structure may have any one of an n-p junction structure, a p-n junction structure, an n-p-n junction structure, and a p-n-p junction structure. Here, the p is a p-type semiconductor layer, the n is an n-type semiconductor layer, and the "-" denotes a structure that a p-type semiconductor layer and an n-type semiconductor layer are in direct or indirect contact with each other.

The light emitting structure may have any one of a lateral structure, a vertical structure, and a via hole type vertical structure.

In the first embodiment, it is illustrated that the light emitting structure and the substrate 110 are components separate from each other, but the substrate 110 may be included as a component of the light emitting structure 110.

The ohmic contact layer 150 may be disposed on the light emitting structure. The ohmic contact layer 150 may be formed to be in ohmic contact with the light emitting structure. For example, the ohmic contact layer 150 may be formed of at least one material selected from the group consisting of indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, and NiO.

The CBL 160 may be disposed between the light emitting structure and the ohmic contact layer 150. The CBL 160 may be formed in a region in which at least a portion of the CBL 160 overlaps with the second pad electrode part 180 in the vertical direction, and accordingly, the light emitting efficiency of the light emitting diode can be improved by reducing a phenomenon that current is concentrated.

The CBL 160 may be formed of a material that has an electrical insulation property or is in schottky contact with the light emitting structure. The CBL 160 may be formed of oxide, nitride, or metal. For example, the CBL 160 may include at least one of $SiO_2$, $SiO_x$, $SiO_xN_y$, $Si_3N_4$, $Al_2O_3$, $TiO_x$, Ti, Al, and Cr.

The first pad electrode part 170 may be disposed on the first conductive semiconductor layer 120 by etching a partial region of the light emitting structure. The first pad electrode part 170 may be disposed on a first electrode 175 to be in contact with the first electrode 175. The first electrode 175 may include at least one selected from the group consisting of Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, and the like.

The second pad electrode part 180 may be disposed on the ohmic contact layer 150. The second pad electrode part 180 may be disposed on a second electrode 185 to be in contact with the second electrode 185. The second pad electrode part 180 may be connected to an external power source to provide power to the light emitting structure. The second pad electrode part 180 may include at least one selected from the group consisting of Cr, V, W, Ti, Zn, Ni, Cu, Al, Au, Mo, Ti/Au/Ti/Pt/Au, Ni/Au/Ti/Pt/Au, Cr/Al/Ni/Cu/Ni/Au, and the like.

FIG. 2 is a plan view of the light emitting diode according to the first embodiment.

Referring to FIGS. 1 and 2, the width of the CBL 160 may become wider as the CBL 160 becomes closer to the first pad electrode part 170 from the second pad electrode part 180.

The width of the CBL 160 may be wider than that of the second electrode 185 in a certain region adjacent to the first pad electrode part 170, and be narrower than that of the second electrode 185 in a certain region adjacent to the second pad electrode part 180.

The CBL 160 may have the maximum horizontal width when the CBL 160 is most adjacent to the first pad electrode part 170, and have the minimum horizontal width when the CBL 160 is most adjacent to the second pad electrode part 180.

The CBL 160 may have a symmetrical structure with respect to the second electrode 185 in a certain region.

That is, unlike the conventional light emitting diode provided with the CBL having a constant width, the line width of the CBL 160 extends in a region adjacent to the first pad electrode part in which a current concentration phenomenon occurs, so that the current concentration phenomenon can be reduced.

Further, the line width of the CBL 160 is narrowed in a region adjacent to the second pad electrode part in which the current concentration phenomenon relatively little occurs, so that light emitting efficiency can be improved.

In the first embodiment, the horizontal width of the vertical section of the CBL 160 may be wider than that of the horizontal section of the second pad electrode part 180.

FIG. 3 is a plan view of the light emitting diode according to the first embodiment.

FIG. 3(*a*) is a view showing a separated electrode pattern of the light emitting diode of FIG. 2, and FIG. 3(*b*) is a view showing a separated CBL pattern of the light emitting diode of FIG. 2.

In FIG. 3(*a*), the widths of first electrode 175 and the second electrode 185 are constant. However, in FIG. 3(*b*), the width of the CBL pattern may be increased as the CBL pattern becomes more adjacent to the first pad electrode part 170, and be decreased as the CBL pattern becomes more adjacent to the second pad electrode part 180.

FIG. 4 is a sectional view of a light emitting diode according to a second embodiment.

FIG. 4 illustrates an application embodiment of a vertical type light emitting diode, and the light emitting diode according to the embodiment may include a CBL 220 on a substrate 210, a second conductive semiconductor layer 230 on the substrate 210 and the CBL 220, an active layer 240 on the second conductive semiconductor layer 230, a first conductive semiconductor layer 250 on the active layer 240, and a first pad electrode part 260 on the first conductive semiconductor layer 250. In FIG. 4, contents identical to those described in FIGS. 1 and 2 will be omitted.

The CBL 220 may be formed in a region in which at least a portion of the CBL 220 overlaps with the first pad electrode part 260 in the vertical direction, and accordingly, the light emitting efficiency of the light emitting diode according to the embodiment can be improved by reducing a phenomenon that current is concentrated.

The CBL 220 may be formed of a material that has an electrical insulation property or is in schottky contact with a light emitting structure. The CBL 220 may be formed of oxide, nitride, or metal. For example, the CBL 220 may include at least one of $SiO_2$, $SiO_x$, $SiO_xN_y$, $Si_3N_4$, $Al_2O_3$, $TiO_x$, Ti, Al, and Cr.

FIG. 5 is a plan view of the light emitting diode according to the second embodiment.

Referring to FIGS. 4 and 5, the width of the CBL 220 may become narrower as the CBL 220 becomes more distant from the first pad electrode part 260.

The width of the CBL 220 may be wider than that of a first electrode 265 in a certain region adjacent to the first pad electrode part 260, and be narrower than that of the first electrode 265 in a certain region spaced apart from the first pad electrode part 260.

That is, the CBL 220 may have the maximum horizontal width when the CBL 220 is most adjacent to the first pad electrode part 260, and have the minimum horizontal width when the CBL 220 is most distant from the first pad electrode part 260.

The CBL 220 may have a symmetrical structure with respect to the first electrode 265 in a certain region.

That is, unlike the conventional light emitting diode provided with the CBL having a constant width, the line width of the CBL 220 extends in a region adjacent to the first pad electrode part 260 in which a current concentration phenomenon occurs, so that the current concentration phenomenon can be reduced.

FIG. 6 is a plan view of the light emitting diode according to the second embodiment.

FIG. 6(*a*) is a view showing a separated electrode pattern of the light emitting diode of FIG. 5, and FIG. 6(*b*) is a view showing a separated CBL pattern of the light emitting diode of FIG. 5.

In FIG. 6(*a*), the width of the first electrode 265 is constant. However, in FIG. 6(*b*), the width of the CBL pattern may be increased as the CBL pattern becomes more adjacent to the first pad electrode part 260, and be decreased as the CBL pattern becomes more distant from the first pad electrode part 260.

FIG. 7 is a plan view of a light emitting diode according to a third embodiment. FIG. 8 is a plan view of a second electrode pad part and a CBL according to the third embodiment.

FIG. 8(*a*) is a view showing a separated electrode pattern of the light emitting diode of FIG. 7, and FIG. 8(*b*) is a view showing a separated CBL pattern of the light emitting diode of FIG. 7.

Referring to FIGS. 7 and 8, the width of a CBL 160*a* may become wider as the CBL 160*a* becomes closer to the first pad electrode part 170 from the second pad electrode part 180.

The CBL 160*a* may include first to third CBL patterns 161, 163, and 165, which have widths different from one another. The first CBL pattern 161 may be disposed adjacent to the second pad electrode part 180, and the third CBL pattern 165 may be disposed adjacent to the first pad electrode part 170. The second CBL pattern 163 may be disposed between the first and third CBL patterns 161 and 165.

The third CBL pattern 165 may have a constant width. The width of the third CBL pattern 165 may be wider than that of the second CBL pattern 163, and be wider than that of the second electrode 185.

The second CBL pattern 163 may have a constant width. The width of the second CBL pattern 163 may be wider than that of the first CBL pattern 161, and be wider than that of the second electrode 185.

The first CBL pattern 161 may have a constant width. The width of the first CBL pattern 161 may be narrower than that of the second electrode 185, but the present invention is not limited thereto. For example, the width of the first CBL pattern 161 may be equal to or wider than that of the second electrode 185.

In the third embodiment, the CBL 160a may have the maximum horizontal width when the CBL 160a is most adjacent to the first pad electrode part 170, and have the minimum horizontal width when the CBL 160a is most adjacent to the second pad electrode part 180. The CBL 160a may have a symmetrical structure with respect to the second electrode 185.

In the third embodiment, it is illustrated that the CBL 160a includes the first to third CBL patterns 161, 162, and 163, but the present invention is not limited thereto. For example, the CBL 160a may include at least two CBL patterns having different thicknesses, or include at least four CBL patterns having different thicknesses.

In the third embodiment, unlike the conventional light emitting diode provided with the CBL having a constant width, the line width of the CBL 160a extends in a region adjacent to the first pad electrode part 170 in which a current concentration phenomenon occurs, so that the current concentration phenomenon can be reduced.

Further, the line width of the CBL 160a is narrowed in a region adjacent to the second pad electrode part 180 in which the current concentration phenomenon relatively little occurs, so that light emitting efficiency can be improved.

FIG. 9 is a plan view of a light emitting diode according to a fourth embodiment. FIG. 10 is a plan view of a second electrode pad part and a CBL according to the fourth embodiment.

FIG. 10(a) is a view showing a separated electrode pattern of the light emitting diode of FIG. 9, and FIG. 10(b) is a view showing a separated CBL pattern of the light emitting diode of FIG. 9.

Referring to FIGS. 9 and 10, the width of a CBL 160b may become thicker as the CBL 160b becomes closer to the first pad electrode part 170 from the second pad electrode part 180.

The CBL 160b may include first to third CBL patterns 162, 164, and 166, which have widths different from one another. The first CBL pattern 162 may be disposed adjacent to the second pad electrode part 180, and the third CBL pattern 166 may be disposed adjacent to the first pad electrode part 170. The second CBL pattern 164 may be disposed between the first and third CBL patterns 162 and 166.

The third CBL pattern 166 may have a width that becomes wider as the third CBL pattern 166 becomes closer to the first pad electrode part 170. The width of the third CBL pattern 166 may be wider than that of the second CBL pattern 164, and be wider than that of the second electrode 185. The third CBL pattern 166 may have a constant first angle of inclination between the third CBL pattern 166 and the second electrode 185. Here, the first angle of inclination may be an internal angle between both side portions of the third CBL pattern 166 and the second electrode 185.

The second CBL pattern 164 may have a width that becomes wider as the second CBL pattern 164 becomes closer to the first pad electrode part 170. The width of the second CBL pattern 164 may be wider than that of the first CBL pattern 162, and be wider than that of the second electrode 185. The second CBL pattern 164 may have a constant second angle of inclination between the second CBL pattern 164 and the second electrode 185. Here, the second angle of inclination may be an internal angle between both side portions of the second CBL pattern 164 and the second electrode 185. In the fourth embodiment, the second angle of inclination may be smaller than the first angle of inclination. In fourth embodiment, the angle of inclination between the CBL 160b and the second electrode 185 may become larger as the CBL 160b becomes closer to the first pad electrode part 170.

The first CBL pattern 162 may have a constant width. The width of the first CBL pattern 162 may be narrower than that of the second electrode 185, but the present invention is not limited thereto. For example, the width of the first CBL pattern 162 may be equal to or wider than that of the second electrode 185.

In the fourth embodiment, the CBL 160b may have the maximum horizontal width when the CBL 160b is most adjacent to the first pad electrode part 170, and have the minimum horizontal width when the CBL 160b is most adjacent to the second pad electrode part 180. The CBL 160b may have a symmetrical structure with respect to the second electrode 185.

In the fourth embodiment, it is illustrated that the CBL 160b includes the first to third CBL patterns 162, 164, and 166, but the present invention is not limited thereto. For example, the CBL 160b may include at least two CBL patterns having different thicknesses, or include at least four CBL patterns having different thicknesses.

In the fourth embodiment, it is illustrated that the first CBL pattern 162 has a constant width, and the angle of inclination between the second CBL pattern 164 and the second electrode 185 is different from that of inclination between the third CBL pattern 166 and the second electrode 185. However, the present invention is not limited thereto. For example, the first to third CBL patterns 162, 164, and 166 may have angles of inclination between the second electrode 185 and the first to third CBL patterns 162, 164, and 166, which are different from one another. In addition, the first and second CBL patterns 162 and 164 may have constant widths, and the third CBL pattern 166 may have a constant angle of inclination between the third CBL pattern 166 and the second electrode 185.

In the fourth embodiment, unlike the conventional light emitting diode provided with the CBL having a constant width, the line width of the CBL 160b extends in a region adjacent to the first pad electrode part 170 in which a current concentration phenomenon occurs, so that the current concentration phenomenon can be reduced.

Further, the line width of the CBL 160b is narrowed in a region adjacent to the second pad electrode part 180 in which the current concentration phenomenon relatively little occurs, so that light emitting efficiency can be improved.

FIG. 11 is a sectional view of a light emitting diode package according to an embodiment.

The light emitting diode package according to the invention can have the light emitting diode having structure described above.

The light emitting diode package 200 includes a package body part 205, a third electrode layer 213 and a fourth electrode layer 214, which are disposed on the package body part 205, a light emitting diode 100 disposed on the package body part 205 to be electrically connected to the third electrode layer 213 and the fourth electrode layer 214, and a molding member 230 surrounding the light emitting diode 100.

The package body part 205 may be formed of a silicon material, a synthetic resin, or a metal material, and an inclined surface may be formed around the light emitting diode 100.

The third electrode layer 213 and the fourth electrode layer 214 are electrically separated from each other, and supply power to the light emitting diode 100. Also, the third electrode layer 213 and the fourth electrode layer 214 may reflect light generated in the light emitting diode 100 to improve light efficiency. The third electrode layer 213 and the fourth electrode layer 214 may release heat generated in the light emitting diode 100 to the outside.

The light emitting diode 100 may be disposed on the package body part 205 or be disposed on the third electrode layer 213 or the fourth electrode layer 214.

The light emitting diode 100 may be electrically connected to the third electrode layer 213 and/or the fourth electrode layer 214 using any one of a wire-bonding method, a flip-chip method, and a die bonding method. In the embodiment, it is illustrated that the light emitting diode 100 is electrically connected to each of the third electrode layer 213 and the fourth electrode layer 214 through a wire, but the present invention is not limited thereto.

The molding member 240 may surround the light emitting diode 100 to protect the light emitting diode 100. Also, the molding member 240 may include a phosphor 232 to vary the wavelength of light emitted from the light emitting diode 100.

FIG. 12 is a view showing a lighting system according to an embodiment.

As shown in FIG. 12, a lighting system according to an embodiment may include a cover 3100, a light source part 3200, a radiator 3300, a circuit part 3400, an inner case 3500, and a socket 3600. The light source part 3200 may include the light emitting diode or the light emitting device module according to the present invention.

The cover 3100 may have a blub shape and is hollow. The cover 3100 has an opening 3110. The light source part 3200 and a member 3350 may be inserted through the opening 3110.

The cover 3100 may be coupled to the radiator 3300, and surround the light source part 3200 and the member 3350. The light source part 3200 and the member 3350 may be blocked from the outside by the coupling between the cover 3100 and the radiator 3300. The cover 3100 may be coupled to the radiator 3300 by an adhesive or various schemes such as a rotation coupling scheme and a hook coupling scheme. The rotation coupling scheme is a scheme where a thread of the cover 3100 is coupled to a screw groove of the radiator 3300, and the cover 3100 is coupled to the radiator 3300 by rotation of the cover 3100. The hook coupling scheme is a scheme where a projection of the cover 3100 is inserted into a groove of the radiator 3300 such that the cover 3100 is coupled to the radiator 3300.

The cover 3100 may be optically coupled to the light source part 3200. In detail, the cover 3100 may diffuse, scatter, or excite light provided from a light emitting diode 3230 of the light source part 3200. The cover 3100 may be a type of optical member. Here, the cover 3100 may be provided at an inner/outer surface or an inside thereof with a luminescence material in order to excite the light supplied from the light source part 3200.

The cover 3100 may include an inner surface coated with a milk-white paint. The milk-white paint may include a diffusion material to diffuse light. The cover 3100 may have the inner surface of which surface roughness is greater than that of the outer surface thereof. The surface roughness is provided for the purpose of sufficiently scattering and diffusing the light from the light source part 3200.

The material of the cover 3100 may include glass, plastic, polypropylene (PP), polyethylene (PE), polycarbonate (PC), and the like. The polycarbonate (PC) has the superior light resistance, heat resistance and strength. The cover 3100 may be transparent such that the light source module 2200 is viewed from the outside, or be opaque. The cover 3100 may be formed through a blow molding scheme.

The light source part 3200 is disposed at the member 3350 of the radiator 3300, and a plurality of light source parts may be disposed. In detail, the light source part 3200 may be disposed in at least one of a plurality of side surfaces of the member 3350. In addition, a top end of the light source part 3200 may be disposed at the side surface of the member 3350.

The light source part 3200 may be disposed at three of six side surfaces of the member 3350. However, the present invention is not limited thereto, and the light source part 3200 may be disposed at all side surfaces of the member 3350. The light source part 3200 may include a substrate 3210 and the light emitting device 3230. The light emitting device 3230 may be disposed on one surface of the substrate 3210.

The substrate 3210 has a rectangular plate shape, but the present invention is not limited thereto. The substrate 3210 may have various shapes. For example, the substrate 3210 may have a circular plate shape or a polygonal plate shape. The substrate 3210 may be provided by printing a circuit pattern on an insulator. For example, the substrate 3210 may include a typical printed circuit board (PCB), a metal core PCB, a flexible PCB, a ceramic PCB, and the like. In addition, the substrate 3210 may have a COB (chips on board) type in which LED chips, which are not packaged, are directly bonded on the PCB. In addition, the substrate 3210 may include a material to effectively reflect light, or the surface of the substrate may have a color such as a white color or a silver color to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting diode 3230 may include a light emitting diode chip to emit red, green, and blue lights or a light emitting diode chip to emit UV. The light emitting diode chip may be of a lateral type or a vertical type. The light emitting diode may emit one of blue, red, yellow, and green lights.

The light emitting diode 3230 may include a luminescence material. The luminescence material may include at least one of garnet-based phosphors (YAG or TAG), silicate-based phosphors, nitride-based phosphors, and oxynitride-based phosphors. Alternatively, the luminescence material may include at least one of a yellow luminescence material, a green luminescence material, and a red luminescence material.

The radiator 3300 is coupled to the cover 3100, and may radiate heat from the light source part 3200. The radiator 330 has a predetermined volume, and includes a top surface 3310 and a side surface 3330. The member 3350 may be disposed on the top surface 3310 of the radiator 3310. The top surface 3310 of the radiator 3300 may be coupled to the cover 3100.

The top surface 3310 of the radiator 3300 may have a shape corresponding to the opening 3110 of the cover 3100.

A plurality of heat radiation pins 3370 may be disposed at the side surface 3330 of the radiator 3300. The heat radiation pin 3370 may extend outwards from the side surface 3330 of the radiator 3300, or be connected to the side surface 3330 of the radiator 3300. The heat radiation pin 3370 may improve heat radiation efficiency by increasing a heat radiation area of the radiator 3300. The side surface 3330 may not include the heat radiation pin 3370.

The member 3350 may be disposed on the top surface of the radiator 3300. The member 3350 may be integrated with or coupled to the top surface 3310 of the radiator 3300. The member 3350 may have the shape of a polygonal prism. In detail, the member 3350 may have the shape of a hexagonal prism. The member 3350 having the shape of a hexagonal prism includes a top surface, a bottom surface, and six side surfaces. The member 3350 may have the shape of a circular prism or the shape of an elliptical prism as well as the shape of a hexagonal prism. When the member 3350 has the shape of a circular prism or the shape of an elliptical prism, the substrate 3210 of the light source part 3200 may be a flexible substrate.

The light source part 3200 may be disposed at the six side surfaces of the member 3350. The light source part 3200 may be disposed at all or some of the six side surfaces of the member 3350. In FIG. 12, the light source part 3200 is disposed at three of the six side surfaces of the member 3350.

The substrate 3210 is disposed at the side surface of the member 3350. The side surface of the member 3350 may be substantially vertical to the top surface 3310 of the radiator 3300. Accordingly, the substrate 3210 and the top surface of the radiator 3300 can be substantially vertical to each other.

The member 3350 may include a material having thermal conductivity. Thus, heat from the light source part 3200 can be rapidly transferred to the member 3350. For example, the material for the member 3350 may include an alloy of metals such as aluminum (Al), nickel (Ni), copper (Cu), magnesium (Mg), silver (Ag), and tin (Sn). Alternatively, the member 3350 may include a plastic material having thermal conductivity. The plastic material having thermal conductivity is lighter than the metal, and has thermal conductivity in a single direction.

The circuit part 3400 receives power from the outside, and converts the received power suitably for the light source part 3200. The circuit part 3400 provides the converted power to the light source part 3200. The circuit part 3400 may be disposed at the radiator 3300. In detail, the circuit part 3400 may be received in the inner case 3500, and be received in the radiator 3300 together with the inner case 3500. The circuit part 3400 may include a circuit board 3410 and a plurality of components mounted on the circuit board 3410.

The circuit board 3410 has a circular plate shape, but the present invention is not limited thereto. That is, the circuit board 3410 may have various shapes. For example, the circuit board may have an elliptical plate shape or a polygonal plate shape. The circuit board 3410 may be provided by printing a circuit pattern on an insulator.

The circuit board 3410 is electrically connected to the substrate 3210 of the light source part 3200. For example, the circuit part 3410 and the substrate 3210 may be electrically connected to each other by a wire. The wire may be disposed inside the radiator 3300 to connect the substrate 3210 to the circuit board 3410.

For example, a plurality of components 3430 may include a direct current converter converting AC power provided from an external power supply into DC power, a driving chip controlling driving of the light source part 3200, and an electrostatic discharge (ESD) protective device.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be changed depending on the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled to the socket 3600. The inner case 3500 may include a connecting part 3530 coupled with the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled to the inner case 3500. In detail, the socket 3600 may be coupled to the connecting part 3530 of the inner case 3500. The socket 3600 may have the same structure as that of a conventional incandescent light bulb. The socket 3600 is electrically connected to the circuit part 3400. For example, the circuit part 3400 and the socket 3600 may be connected to each other by a wire. Accordingly, if external power is applied to the socket 3600, the external power can be transferred to the circuit part 3400. The socket 3600 may have a screw groove structure corresponding to a thread structure of the connecting part 3530.

The invention claimed is:
1. A light emitting diode comprising:
a light emitting structure including a first conductive semiconductor layer, an active layer, and a second conductive semiconductor layer;
a first pad electrode part on the first conductive semiconductor layer;
a first electrode connected to the first pad electrode part;
a current blocking layer on the second conductive semiconductor layer;
a second electrode on the second conductive semiconductor layer and the current blocking layer; and
a second pad electrode part on the second conductive semiconductor layer,
wherein the second electrode includes a first part closer to the second pad electrode part than to the first pad electrode part and a second part closer to the first pad electrode part than to the second pad electrode part,
wherein the first part of the second electrode is connected to the second pad electrode part,
wherein the second part of the second electrode extends from the first part,
wherein the current blocking layer includes a first region overlapped with the first part of the second electrode in a vertical direction and a second region overlapped with the second part of the second electrode,
wherein a width of the second region of the current blocking layer is wider than a width of the first region,
wherein the width of the second region of the current blocking layer is wider than a width of the second part of the second electrode,
wherein the current blocking layer extends across an entire length of the first pad electrode part and across an entire distance between the first pad electrode part and the second pad electrode part, wherein at least one end of the current blocking layer extends toward the first pad electrode part, wherein the second region of the current blocking layer includes a plurality of blocking portions extending toward the first pad electrode part from the second pad electrode part, each blocking portion having a different width with respect to the other blocking portions of the plurality of blocking portions, and wherein each of the plurality of blocking portions has a constant width.

2. The light emitting diode of claim 1, wherein a portion of the first region of the current blocking layer is adjacent to the second pad electrode part and has a width smaller than a width of the second electrode.

3. The light emitting diode of claim 1, wherein a region of the current blocking layer which is most adjacent to the first pad electrode part has a maximum horizontal width.

4. The light emitting diode of claim 1, wherein a region of the current blocking layer which is most adjacent to the second pad electrode part has a minimum horizontal width.

5. The light emitting diode of claim 1, wherein the second region of the current blocking layer has a symmetrical structure with respect to the second electrode which is overlapped with the second region in the vertical direction.

6. The light emitting diode of claim 1, wherein the first electrode is connected to the first pad electrode part, and a width of the first electrode is constant, and wherein a width of the second electrode is constant.

7. The light emitting diode of claim 1, wherein the first part of the second electrode has a width the same as the second part.

8. The light emitting diode of claim 1, further comprising a conductive layer disposed between the current blocking layer and the second pad electrode part, wherein the conductive layer is disposed on the second conductive semiconductor layer, wherein the current blocking layer is disposed between the light emitting structure and the conductive layer, and wherein the current blocking layer includes a third region overlapped with the conductive layer and the second electrode pad part in the vertical direction.

9. A light emitting diode comprising:
a substrate;
a light emitting structure including a first conductive semiconductor layer on the substrate, a second conductive semiconductor layer on the first conductive semiconductor layer and an active layer between the first and second semiconductor layers;
a first pad electrode part on the first conductive semiconductor layer;
a first electrode connected to the first pad electrode part;
a conductive layer on the second conductive semiconductor layer;
a second pad electrode part on a portion of the second conductive semiconductor layer;

a current blocking layer disposed between the light emitting structure and the conducive layer; and a second electrode extending to a region adjacent to the first pad electrode part from the second pad electrode part, wherein the second electrode includes a first part closer to the second pad electrode part than to the first pad electrode part and a second part closer to the first pad electrode part than to the second pad electrode part, wherein the first part of the second electrode is connected to the second pad electrode part, wherein the second part of the second electrode extends from the first part, wherein the current blocking layer includes a first region overlapped with the first part of the second electrode in a vertical direction and a second region overlapped with the second part of the second electrode, wherein a width of the second region of the current blocking layer is wider than a width of the first region, wherein the width of the second region of the current blocking layer is wider than a width of the second part of the second electrode, wherein the width of the first region is consistent along an entire length of the first region, wherein the width of the second region is consistent along an entire length of the second region, and wherein at least one end of the current blocking layer extends toward the first pad electrode part.

10. The light emitting diode of claim 9, wherein the second electrode includes a plurality of branch patterns extending to a different direction from each other from the second pad electrode part, and wherein the current blocking layer includes a plurality of blocking patterns extending along the plurality of branch patterns from the second pad electrode part.

11. The light emitting diode of claim 9, wherein the current blocking layer includes a third region, and wherein a width of the third region is wider than the width of the second region.

12. The light emitting diode of claim 10, wherein the first electrode includes a plurality of branch patterns extending to a different direction from each other from the first pad electrode part, and wherein one of the plurality of branch pattern of the second electrode is disposed parallel to the branch patterns of the first electrode.

13. The light emitting diode of claim 10, wherein a portion of the branch patterns of the second electrode includes a curved pattern extending toward a direction of the first pad electrode part, and wherein an end portion of the second region of the current blocking layer has a curved shape and is disposed around an outer region of the curved pattern.

14. The light emitting diode of claim 9, wherein the second electrode includes a curved pattern at an end portion of the second part, and wherein an end portion of the second region of the current blocking layer has a curved shape.

* * * * *